(12) United States Patent
Haq et al.

(10) Patent No.: US 9,640,747 B2
(45) Date of Patent: May 2, 2017

(54) THERMOELECTRIC DEVICE

(75) Inventors: Sajad Haq, Mansewood (GB); Michael Dunleavy, Bristol (GB); Martyn John Hucker, Woolaston (GB); Joseph Maurice Davies, Bristol (GB)

(73) Assignee: BAE SYSTEMS PLC, London (GB)

( * ) Notice: Subject to any disclaimer, the term of this patent is extended or adjusted under 35 U.S.C. 154(b) by 367 days.

(21) Appl. No.: 14/115,500

(22) PCT Filed: May 1, 2012

(86) PCT No.: PCT/GB2012/050954
§ 371 (c)(1),
(2), (4) Date: Nov. 4, 2013

(87) PCT Pub. No.: WO2012/150449
PCT Pub. Date: Nov. 8, 2012

(65) Prior Publication Data
US 2014/0083477 A1     Mar. 27, 2014

(30) Foreign Application Priority Data

May 4, 2011  (EP) .................................. 11275072
May 4, 2011  (GB) ................................. 1107372.3

(51) Int. Cl.
*H01L 35/28*      (2006.01)
*H01L 35/32*      (2006.01)
(Continued)

(52) U.S. Cl.
CPC ............. *H01L 35/32* (2013.01); *H01L 35/24* (2013.01); *H01L 35/34* (2013.01); *B64D 41/00* (2013.01)

(58) Field of Classification Search
None
See application file for complete search history.

(56) References Cited

U.S. PATENT DOCUMENTS 5,973,050 A     10/1999   Johnson et al.
6,127,619 A *   10/2000   Xi ........................... H01L 35/16
                                                          136/201

(Continued)

FOREIGN PATENT DOCUMENTS

DE     10 2010 031 829       2/2011
EP      1 030 379 A1          8/2000
(Continued)

OTHER PUBLICATIONS

International Search Report (PCT/ISA/210) mailed on Aug. 27, 2012, by the United Kingdom Patent Office as the International Searching Authority for International Application No. PCT/GB2012/050954.

(Continued)

*Primary Examiner* — Eli Mekhlin
(74) *Attorney, Agent, or Firm* — Maine Cernota & Rardin (57) ABSTRACT

The disclosed relates to a thermoelectric device for generating electrical currents exploiting the Seebeck effect, more specifically a structural thermoelectric device which can replace a structural component of a body. The structural thermoelectric device can include a first conductor layer, a second conductor layer and located therebetween a polymer thermocouple layer having a reinforcement formed from a structural support, wherein the internal surface of the support includes at least one layer of at least one conducting polymer. The reinforcement can be is porous material with a plurality of voids, wherein the internal surfaces of the voids are coated with a conducting polymer, which is capable of providing the Peltier effect.

19 Claims, 5 Drawing Sheets

(51) Int. Cl.
*H01L 35/24* (2006.01)
*H01L 35/34* (2006.01)
*B64D 41/00* (2006.01)

(56) References Cited

U.S. PATENT DOCUMENTS

| | | | |
|---|---|---|---|
| 6,260,360 B1 * | 7/2001 | Wheeler | A01N 1/02 362/371 |
| 6,288,322 B1 | 9/2001 | Kawasaki et al. | |
| 2004/0101752 A1 * | 5/2004 | Oosawa | H01M 4/0416 429/217 |
| 2005/0280128 A1 * | 12/2005 | Mok | H01L 23/427 257/678 |
| 2007/0221264 A1 | 9/2007 | Shutoh et al. | |
| 2007/0277866 A1 * | 12/2007 | Sander | H01L 35/32 136/230 |
| 2008/0121263 A1 | 5/2008 | Schutte et al. | |
| 2008/0135081 A1 | 6/2008 | Sharifi et al. | |
| 2010/0186422 A1 * | 7/2010 | Yang | H01L 35/30 62/3.3 |
| 2011/0050048 A1 * | 3/2011 | Suda | F03G 7/005 310/363 |
| 2011/0111266 A1 | 5/2011 | Hucker et al. | |
| 2011/0120516 A1 | 5/2011 | Laudo | |

FOREIGN PATENT DOCUMENTS

| | | |
|---|---|---|
| EP | 1 818 992 A1 | 8/2007 |
| JP | 2006-114793 A | 4/2006 |
| JP | 2010004313 A | 1/2010 |
| JP | 2010027895 A * | 2/2010 |
| WO | WO 2008/073668 A2 | 6/2008 |
| WO | WO 2009/029393 A1 | 3/2009 |
| WO | WO 2009/063805 A1 | 5/2009 |
| WO | WO 2010/004313 A1 | 1/2010 |

OTHER PUBLICATIONS

European Search Report issued on Oct. 6, 2011.
United Kingdom Search Report issued on Sep. 28, 2011.
Notification Concerning Transmittal of International Preliminary Report on Patentability (Forms PCT/IB/326 and PCT/IB/373) and the Written Opinion of the International Searching Authority (Form PCT/ISA/237) issued on Nov. 14, 2013, by the International Bureau of WIPO in corresponding International Application No. PCT/GB2012/050954. (9 pages).
Shakouri, Ali et al., "Thermoelectric Power Factor for Electrically Conductive Polymers", Proceedings of International Conference on Thermoelectrics, Sep. 1999, 6 pages.
Kim, Dasaroyong et al., "Improved Thermoelectric Behavior of Nanotube-Filled Polymer Composites With Poly (3,4-ethylenedioxythiophene) Poly (styrenesulfonate)", American Chemical Society, 2010, pp. 513-523, vol. 4, No. 1.

* cited by examiner

THERMOELECTRIC DEVICE

The following invention relates to a thermoelectric device for generating electrical currents exploiting the Seebeck effect, more specifically a structural thermoelectric device which can replace a structural component of a body.

Thermoelectric generators convert heat directly into electrical power through the Seebeck effect. When a temperature gradient is applied across a length of electrically conductive material, there is a net flow of electrons from one end to the other that results in voltage generation. If an electrical load is connected between the ends of the conductor, a constant thermal gradient will result in a constant electrical power output. This mechanism allows useful conversion of thermal energy into electrical energy. The mechanism can be run in reverse i.e. application of electrical energy can be used for cooling, known as the Peltier effect.

For practical thermoelectric devices, semiconductor materials such as bismuth telluride are used as they have a higher Seebeck coefficient (S) than metals. The Seebeck coefficient quantifies the voltage generated for a given temperature difference across the material.

According to a first aspect of the invention there is provided a structural thermoelectric device comprising a first conductor layer, a second conductor layer and located therebetween a polymer thermocouple layer comprising reinforcement means formed from a structural support, wherein the internal surface of said support comprises at least one layer of at least one conducting polymer, in a highly preferred arrangement the polymer thermocouple layer comprises at least one P-type conducting polymer, and at least one N-type conducting polymer.

It is possible to dope conducting polymers by adding chemical reactants to oxidise or reduce the system. This means that both P-type and N-type conducting polymers may be fabricated, giving two polymeric materials with opposite Seebeck coefficient, thus providing a larger voltage difference for the same cell dimension.

Commercially available thermoelectric devices are typically fabricated using bismuth telluride (BiTe) semiconductors. One of problems with semiconductors is that they are relatively fragile and so not amenable to large area deposition and are not rugged. In general, a plurality of small thermoelectric modules have to be used in order to achieve large area coverage and the concomitant high levels of power generation. The Commercial Off The Shelf ("COTS") devices are generally small area, with typical surface areas of ~250 mm$^2$ and thicknesses of ~4 mm.

Therefore the use of conducting polymers as the polymer thermocouple layer components in a thermoelectric device permits facile fabrication of devices which can be formed to provide large area devices, which may in turn be formed into shaped structures to replace conventional structural panels on a body such as a replacement panel on a vehicle vessel or craft. Furthermore, devices according to the invention are rugged, robust and hence will provide a thermoelectric device which may withstand harsh environments, in a similar fashion to many composite fibre reinforced polymers.

The polymer thermoelectric device according to the invention thus provides a useful replacement to the brittle bismuth telluride structures.

In an alternative arrangement the final polymer thermoelectric device may have additional plasticisers so as to provide a non-rigid, i.e. flexible thermoelectric device.

The reinforcement means is a structural support and may be selected from an intrinsically porous material or a rigid porous three dimensional lattice, comprising a plurality of voids, wherein the internal surface of said support, i.e. the internal surface of the voids, comprises at least one layer of at least one conducting polymer. The porous material is selected such that it provides structural integrity to the final thermoelectric device, such that it has load bearing properties. Preferably the reinforcement means is a rigid porous three dimensional lattice or an intrinsically porous material into which said at least one layer of at least one P-type conducting polymer, and at least one layer of at least one N-type conducting polymer may be deposed. Preferably the reinforcement means structural support may be formed into the near final shape or final shape of a body. Preferably the reinforcement means does not improve the conduction of heat within the polymer thermocouple layer, i.e. between the first and second conductor layers.

The reinforcement means, may be a structural lattice and may comprise a machine manufactured series of elongate voids, a first void comprising an N-type conducting polymer and a second void comprising a P-type conducting polymer, such that an array of N-type and P-type polymers may be provided. To permit an in series electrical connection between the N-type and P-type polymers there may be an electrical connector which electrically connects the N-type conducting polymer in said first void to the P-type conducting polymer in said second void. Preferably the electrical connector attaches to distal end portions of the respective conducting polymers, so as to permit the greatest voltage difference between the respective end portions of each conducting polymer type.

In a highly preferred arrangement the reinforcement means may be selected from any porous network material, such as, for example an intrinsically porous material. The intrinsic nature is typically provided via chemical reactions to form the voids, which may be synthetic or naturally occurring processes. The porous material may be formed from organic or inorganic materials, such as porous polymers, Conjugated Microporous Polymers ("CMPs"), zeolites, metalorganic polymers, Poly(Ethylene Glycol) ("PEG") gels, aerogels, solgels or Polymers with Intrinsic Microporosity (PIMs). Preferably the reinforcement means is an intrinsically porous material, which may have a structure that is microporous, mesoporous or macroporous, more preferably having a void diameter less than 100 microns. The voids within the material are the internal surface, which is subsequently coated with the conducting polymer.

The conducting polymers may be deposited onto the surfaces of the porous lattice or porous network, by any known technique, such as spraying, brushing, rollering, printing, dipping, preferably by any means which allows layerwise deposition, to provide a surface coating. The conducting polymer may be coated onto the surface of the porous network or lattice, by causing the conducting polymer to flow into the voids under positive or negative pressure. The conducting polymer may be dissolved or suspended in a solvent or carrier and the solvent or carrier removed to leave a surface coating of conducting polymer on the internal surface of the voids. The thermoelectric effect is achieved by a layer effect, typically less than 10 millimeter thickness, preferably less than 1 millimeter thickness. If the conducting polymer layer is too thick then the thermoelectric device may have a large mass penalty, reducing its desirability in mass sensitive applications. In a highly preferred arrangement the conducting polymer does not completely fill the voids in the porous lattice or porous network, as this may promote efficient thermal transfer between voids and would therefore reduce the temperature difference between the first and second conducting layers, and hence reduce the voltage set up between the first and second conducting layers. The thickness of the deposited conducting polymer layer may depend on the dimensions of the voids within the porous lattice or porous network, Where the internal dimensions of the voids within the lattice approach that of a layer of deposed conducting polymer then care must be taken to avoid the entire void being filled, preferably the layer is a surface coating and does not fill the voids, so as to reduce thermal heat transfer between the first and second conductor layers.

The conducting polymer is a surface coating on the internal surface of the voids within the porous lattice or porous network, preferably less than 75% of the volume of the voids is filled with the conducting polymer, more preferably less than 50% is filled, yet more preferably less than 25% is filled. This ensures that there is a portion of substantially each void which does not promote efficient thermal conductivity. The coated voids may then be evacuated or filled with air or any suitable gas.

The conducting polymers may be selected from any conducting polymer, such as, for example, polythiophenes (PT) poly acetylenes (PAG), poly anilines (PANI), poly pyrroles (PPY), poly phenylene vinylene (PPV), poly phenylene sulfide (PPS). A particular preferred polymer is Poly(3,4-ethylenedioxythiophene) (PSS:PEDOT).

In a preferred arrangement the polymer thermocouple layer region may additionally comprise fibres or filler materials, such as for example particulates, nano tubes, fibres, to promote cohesion, rigidity, and alter the electrical conductivity of said conducting polymers, and hence the polymer thermocouple layer per se. The filler materials must not enhance the thermal conductivity of the conducting polymer, as any conductance of heat from the first conductor layer to the second conductor layer will reduce the output voltage that may be obtained. The fibres may provide further structural rigidity, as for fibre reinforced polymer composites.

Filler materials which intrinsically possess thermoelectric properties may also be included as macro, micro or nano scale particles dispersed within the conducting polymer, such as, for example, bismuth telluride, silicon-germanium alloys, lead tellurides.

In a highly preferred embodiment the conducting polymers may be doped to further broaden the Seebeck coefficient between the selected conducting polymers. The conducting polymers may be chemically altered, such as by oxidation or reduction techniques to create P-type or N-type regions respectively. Alternatively the polymers may be doped with known donor or acceptor moieties to provide respective N-type or P-type conducting polymers.

In a highly preferred embodiment any chemical oxidation or reduction process on the conducting polymers is performed before the final cure reaction.

The conducting polymers may be formed from monomers, oligomers or polymers that have the ability to undergo a cure i.e. polymerisation. Where the uncured conducting polymer material is already a long chain polymer the solidification process may simply be a cross linking reaction to provide the cured conducting polymer which is either deposited on or encapsulates the reinforcement means. It may be desirable to add further non-conducting monomers, oligomers or polymers to regions of the reinforcement means, which are capable of undergoing a cure to increase the structural rigidity. The further non-conducting monomers may be mixed with the conducting polymers and then cured in the form of an admixture or the further non-conducting monomers may be added as a separate layer, which may be cured either together or in separate curing steps.

In a preferred aspect of the invention there is provided a structural thermoelectric device comprising a first conductor layer, a second conductor layer and located therebetween a polymer thermocouple layer comprising a structural support, said support comprising a porous material with a plurality of voids, wherein the internal surface of said voids comprises at least one layer of at least one conducting polymer, wherein less than 75% of the volume of the void is filled with said at least one conducting polymer. The structural support may be a three dimensional lattice, which is subsequently filled with a porous material, to increase the surface area for the conducting polymer.

To facilitate construction of the device, the connector, where present, is an electrically conducting material deposited onto the surface of the first and second conductor layers, in a pattern which aligns with the respective N-type and P-type conducting polymers.

In a further embodiment the reinforcement fibres may additionally be present in the conducting polymers that are deposed onto the reinforcement means, said reinforcement means being preferably selected from a rigid lattice or porous material, such that the reinforcement fibres provide additional strength and rigidity to the final cured device.

The first and second conductor layers and any electrical connectors may be formed from discrete portions of a conducting material and applied to the upper and lower surfaces of the formed polymer thermocouple layer. Alternatively, the first and second conductor layers, and optionally any electrical connectors may be deposited by direct metallic printing, chemical or vapour deposition processes, etching processes. The first and second conductor layers, may be coated with further materials to protect said first and second conductor layers from chemical or physical damage, provided that there is minimal conductive loss. The further materials may be conducting materials such as, for example metallic materials.

In a further arrangement there may be a plurality of polymer thermocouple layers, each comprising arrangements of N- and P-type conducting polymers, arranged between a first and second conductor layer. In a yet further arrangement there may be provided at least two devices according to the invention in a stacked arrangement such that a second conductor layer from a first device is located in thermal contact with a first conductor layer form a second device. The arrangement thereby providing, at least two stacked devices, with a first conductor layer on the first device exposed to one temperature and the second conductor layer on the second device being exposed to a second temperature.

In a further aspect of the invention there is provided an electrical system comprising at least one, preferably a plurality of thermoelectric devices according to invention, wherein the outputs from each N- and P-type conducting polymer are wired such that their voltage outputs are additive i.e. are in series, to provide a large output voltage across the first and second conductor layers.

The thermoelectric device and hence electrical system will generate energy all the time there is a temperature differential between the first and second conductor layers. It may be desirable to store part or all of the electrical energy generated by the thermoelectric effect, for use at a later time. The energy may be stored by any conventional means, such as chemical energy cells, capacitors or more preferably via a polymer composite battery that may be constructed on or form an integral part of the first or second conductor layer. The composite battery may preferably be constructed on the conductor layer which provides optimum working conditions for the composite battery, such as for example the conductor layer which is closest to room temperature.

In a further aspect of the invention there is provided a body comprising at least one thermoelectric device according to the invention. The body may be a panel, housing, or moulded entity which may be used in place of an existing non-thermoelectric panel, housing, or moulded entity, such as for example a panel on a vehicle, building, structure may be replaced by a panel formed from a thermoelectric device according to the invention. In a preferred embodiment, the thermoelectric panel is located on an aircraft, where there are large temperature extremes between the outside of the aircraft and the inside of the aircraft.

Typical examples of a thermoelectric housing, may be exhaust or heat exchanger regions, particularly near powertrains on a vehicle, vessels or crafts, such as for example exhausts on combustion engines or turbines.

According to a further aspect of the invention there is provided the use of a structural polymer thermoelectric device according to the invention for generating electrical energy. The ability to generate electricity from a structural panel with a similar weight to an existing panel already in place on a vehicle, vessel or craft, provides a very useful means of generating power, without placing extra burden on the primary power source.

According to a yet further aspect of the invention there is provided the use of a structural polymer thermoelectric device according to the invention for providing a Peltier cooling effect to the first or second conductor layer. Semiconductor based Peltier elements are widely used in cooling, the use of a structural thermoelectric polymer based Peltier element provides an advantage that the actual casing or housing that require cooling, may be made from a structural polymer that has the ability to cool, or indeed heat if so required.

According to a further aspect of the invention there is provided a method of forming a device according to the invention, comprising the steps of providing a rigid porous three dimensional lattice, deposing at least one P-type conducting polymer into a first predetermined region, deposing at least one N-type conducting polymer, into a second predetermined region, deposing an electrical connector between said polymer regions, encapsulating said filled lattice between a first and second conductor layer.

Preferably the lattice has elongate voids, with the P-type and N-type conducting polymers being deposed therein, such that there is a voltage set up along the length of the deposed conducting polymers contained within each elongate void. Preferably the lattice is made from a substantially non-conducting material such that the only electrical pathway for the voltage is to flow in a predetermined pattern, i.e. in series between adjacent N-type and P-type polymers to provide an accumulated voltage. The elongate voids may have any cross-section, preferable one which allows close packing and provides rigidity, such as circular or polygonal cross section, preferably quadrilateral, pentagonal, hexagonal or octagonal.

A yet further method comprises the steps of providing a first conductor layer, deposing at least one P-type conducting polymer, with a reinforcement means provided therein, into a first predetermined region, deposing at least one N-type conducting polymer, with a reinforcement means provided therein, into a second predetermined region, arranged such that there is an electrical junction provided between said N-type and P-type polymers, encapsulating said polymers with said second conductor layer.

In a semi conductor device, two semiconductor materials are used to form a thermocouple, with the two materials having Seebeck coefficients of opposite sign to give greater efficiency and a higher power generation capacity. Thermoelectric modules typically consist of many thermocouples connected electrically in series in order to provide useful voltages.

The voltage generated by a thermoelectric element of this type is given by $$U=(S_P-S_N)(T_h-T_C) \tag{Eq.1}$$

where $S_P-S_N$ is the difference between the two Seebeck coefficients and $T_h-T_c$ is the temperature difference across the module. Other relevant quantifiable characteristics of the devices include the figure of merit, ZT, and the conversion efficiency η. The figure of merit is given by $$Z\overline{T} = \frac{(S_p - S_n)^2 \overline{T}}{[(\rho_n\kappa_n)^{0.5} + (\rho_p\kappa_p)^{0.5}]^2} \tag{Eq. 2}$$

where $\rho_N$ and $\rho_P$ are the respective electrical resistivities and $\kappa_N$ and $\kappa_P$ are the respective thermal conductivities. T is the average temperature across the thermocouple. The thermoelectric conversion efficiency is related to the figure of merit by $$\eta_{max} = \left(\frac{T_h - T_c}{T_h}\right) \frac{\sqrt{1+Z\overline{T}} - 1}{\sqrt{1+Z\overline{T}} + \left[\frac{T_c}{T_h}\right]} \tag{Eq. 3}$$

Equations 2 and 3 show that the conversion efficiency is dependent upon a number of factors, including the temperature difference across the device (ΔT), the Seebeck coefficient, the thermal conductivity, the electrical conductivity and the absolute temperature.

Thermoelectric generators can be used in any situation where there is a suitable temperature differential between the first and second conductor layers, i.e. essentially a hot and cold side. In order to improve the efficiency it is desirable to have a good thermal coupling of the device to the heat source and optionally provide a heat sink to remove heat from the cold side. Mechanical means for mounting the devices are usually needed, and the device type needs to be appropriate for the operational temperature.

In an alternative arrangement the reinforcement means may be selected from a plurality of fibres, such as to provide a fibre reinforced polymer composite material (FRPC). The polymers and reinforcement fibres may be moulded into a final or near final shape, and then cured using standard techniques, so as to provide a body which is capable of undergoing a thermoelectric effect. In a preferred option the fibres are selected from electrically conducting fibres or electrically non-conducting fibres which are coated with an electrically conducting material.

An embodiment of the invention will now be described by way of example only and with reference to the accompanying drawings of which:—

Figure 1:
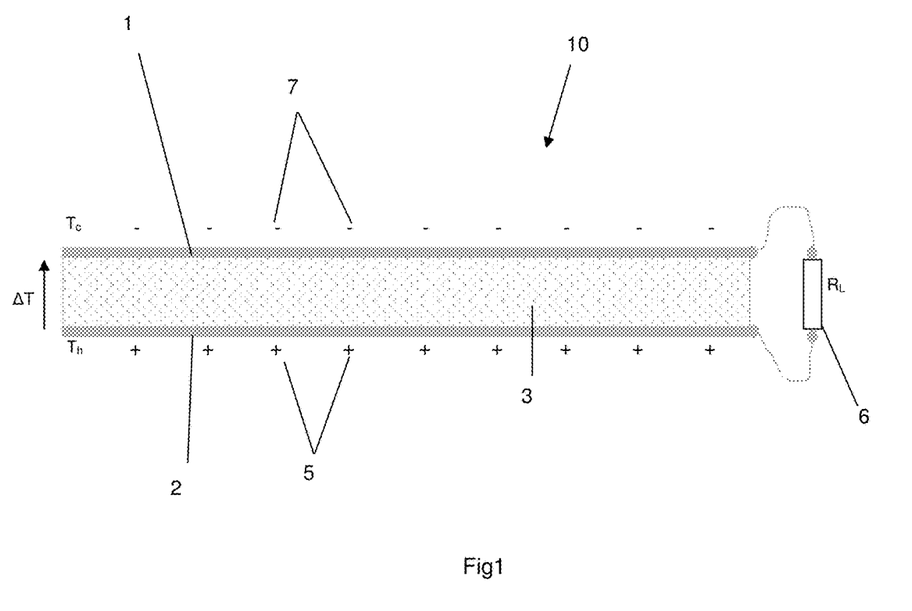
FIG. 1 shows a side projection of a single thermoelectric cell

Turning to FIG. 1, this shows a simple single layer fibre reinforced thermoelectric polymer device 10, with a first conductor layer 1, and second conductor layer 2 applied to the top and bottom of the polymer thermocouple composite layer 3. The polymer thermocouple layer may contain one type of conducting polymer, however this will limit the voltage that is achieved between the first and second conductor layers 1, 2.

When a temperature differential is applied across the polymer thermocouple 3, the thermoelectric effect will result in a net drift of electrons 5 from the hot side $T_h$, to the cold side $T_c$, 7 nominally shown as the first conductor layer 1, of the composite thus generating a voltage. This would enable current flow to be generated through a load resistance $R_L$ 6.

The construction of the device 10 is simple and may use current FRPC lay up and curing technology, as the polymers are very durable and rugged any such device 10 is therefore amenable to large area fabrication with good structural properties. However, while the current that is drawn may be reasonable if the composite is fabricated over a large area, the voltage produced by this structure is unlikely to exceed a few tens of millivolts as it is in effect a single thermoelectric element. A DC-DC converter (not shown) may be used to step up the voltage if required. The first and second conductor layers 1, 2, may be formed by depositing a suitable conducting material onto the upper and lower surfaces of the polymer thermocouple composite layer 3, and could be protected by the addition of further protective layers.

Figure 2:
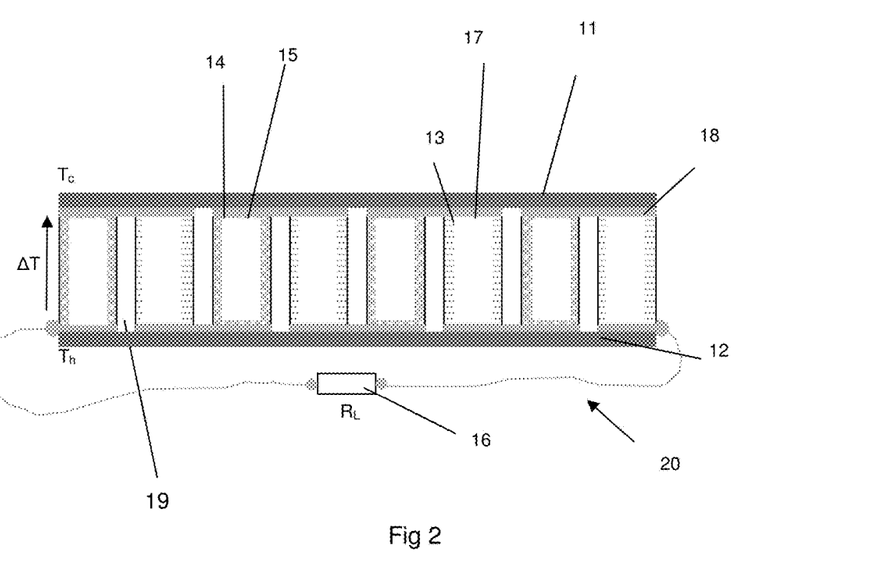
FIG. 2 is a side projection of a multi element thermoelectric cell

FIG. 2 shows side projection of a multi element thermoelectric cell 20. To produce higher voltages from a composite structure the use of P-type 14 and N-type 13 conducting polymers are arranged in cells, as described earlier the doping is performed by using chemical reactants to oxidise or reduce the system, giving two polymeric materials with opposite Seebeck coefficient. The P-type and N-type material are applied as surface coatings to the interior surface of the cells, and hence do not fill the cells.

The cell 20 has a first conductor layer 11 nominally shown here as the cold layer $T_c$, and a second conductor layer 12, nominally the hot layer $T_h$. In the above arrangement, the N-type material 14, sets up a negative voltage 15 at the cold surface (first conductor layer) 11. Whereas, the P-type material 13, sets up a positive voltage 17 at the cold surface (first conductor layer) 11, the N-type and P-type materials are electrically isolated from each other along their longest dimension by a barrier 19, which may be a void or dielectric material. Therefore the use of an electrical connector 18 located between the N-type 14 and P-type 13 at the end portion means that the voltage that can be generated will be increased to useful levels by the summation of the voltages produced across each element 13 and 14. There may be further encapsulation by carbon fibre skins applied top and bottom on the first layer 11 and second layer 12 to provide further stiffness.

Figure 3:
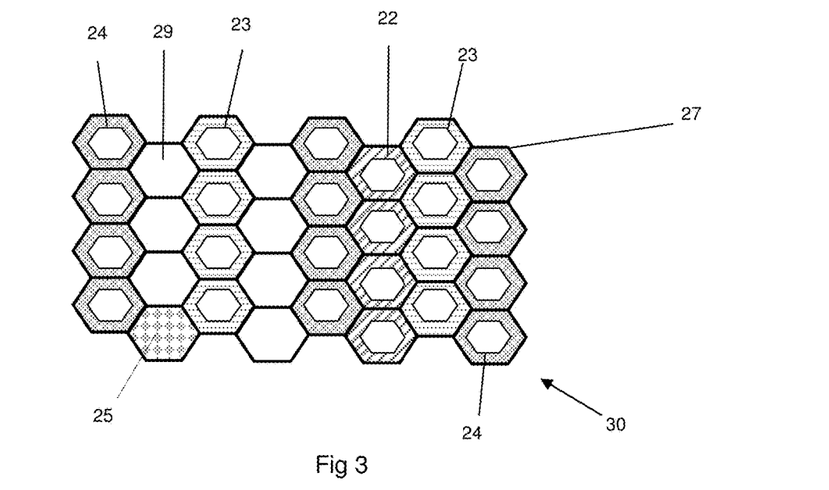
FIG. 3 shows a top view of a multi element thermoelectric cell.

FIG. 3 shows a top view of one arrangement of a lattice 30 with hexagonal elongate voids. One row of elongate voids are coated on their interior surface with the conducting polymer 23,24. There is a row 29 of empty, non-filled elongate voids, separating a row filled elongate voids containing P-type conducting polymer 23. Alternatively the row between the N-type and P-type material may be filed with a further polymer 22, so as to provide further rigidity and structural stiffness to the final cured device. The lattice material 27 is a non-conducting material, so in a further arrangement the P-type conducting polymer 23 and N-type conducting polymer 24 may only be separated by the lattice. The end portion of 23 and 24 will be electrically connected together in a manner as shown in FIG. 2.

Additionally the hexagonal voids may be filled with a porous material 25 which provides a plurality of voids, the interior surface of the voids may then be coated with the respective conducting polymers, 23, 24. The voids will give a significant increase in surface area to be coated, thus increasing the voltage generated by the Seebeck effect. The use of porous material 25 within a lattice material 27 allows the lattice material to be formed into a final shape, and then a porous material may be added or caused to form in said lattice, thus allowing easy constructions, and facile separation of P and N type materials.

Figure 4:
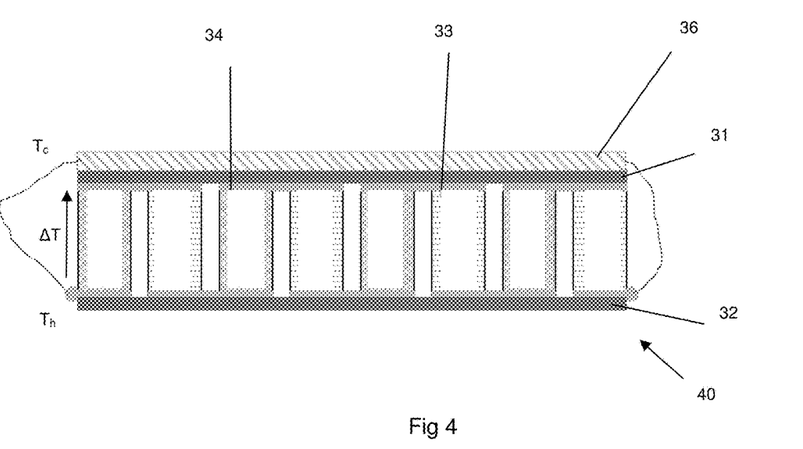
FIG. 4 shows a side view of a multi element thermoelectric cell with a composite battery located thereon.

FIG. 4 shows a side view of a multi element thermoelectric cell 40 with a composite battery 36 located thereon. The battery 36 is located on the first conductor layer 31, which in this example is the nominally cold surface $T_c$. It is desirable that the battery is formed on the most appropriate surface. If the cold surface is excessively cold or the cold layer forms part of an exterior surface on a vehicle vessel or craft, then it may be desirable to locate the battery on the second conductor layer 32. In a similar arrangement to that of FIG. 2, to produce higher voltages from a composite structure the use of P-type 34 and N-type 33 conducting polymers are arranged in cells, as described earlier the doping is performed by using chemical reactants to oxidise or reduce the system, giving two polymeric materials with opposite Seebeck coefficient.

Figure 5:
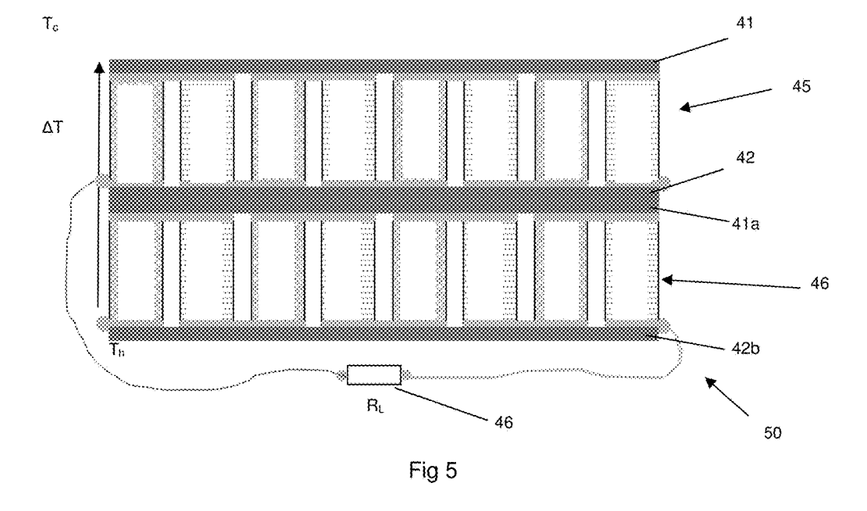
FIG. 5 shows a side view of a stacked arrangement of multi element thermoelectric cell.

FIG. 5 shows a side view of a stacked arrangement 50 of two multi element thermoelectric cells 45 and 46. The first conductor layer 41 of the top most cells 45, forms the outer cold facing surface $T_c$. The second conductor layer 42 of the top most cell 45 is in thermal contact with the first conductor layer 41a of the lower cell 46, and the second conductor layer 42b of the lower cell 46, forms the outer hot facing surface $T_h$.

Figure 6A:
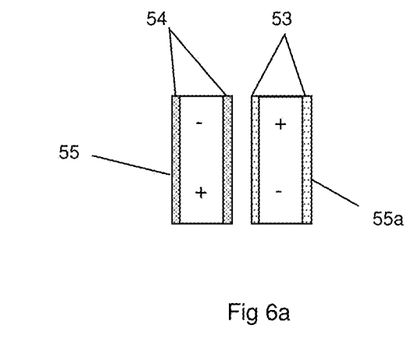
FIGS. 6a and 6b show side and top views respectively of a conducting polymer coated lattice matrix.
Figure 6B:
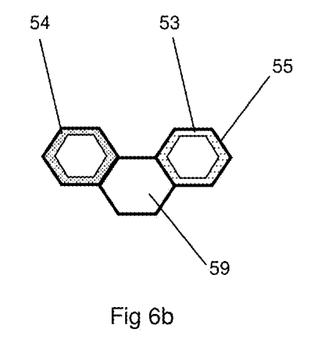

FIG. 6a shows a close up of the voids in FIG. 2, wall 55 of the void has a surface coating 54 of a P-type conducting polymer. In a similar fashion wall 55a has a surface coating 53 of an N-type conducting polymer. FIG. 6b shows a top view of the hexagonal cross section structure in FIG. 3, where the wall 55 of the honeycomb like structure has surface coatings of P-type 54 and N-type 53 conducting polymers. The specific arrangement shows the two cells being separated by an empty non-coated cell 59.

Figure 7A:
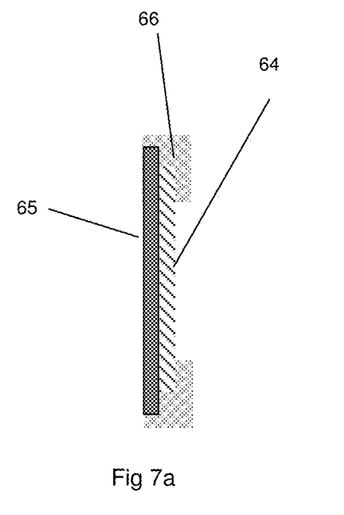
FIGS. 7a and 7b show electrical connector arrangements of matrix wall coated with a conducting polymer material.

FIG. 7a shows one arrangement of a wall 65 of a void within a matrix (as shown in FIG. 6a) which has a surface coating of a conducting polymer 64 deposed thereon. The conducting polymer 64 may be electrically connected by a subsequent deposition of a conducting element 66, such as a conductive ink or paste. The element 66 may then be further connected to electrical connectors (18, as shown in FIG. 2), which connect the P-type and N-type columns in series.

Figure 7B:
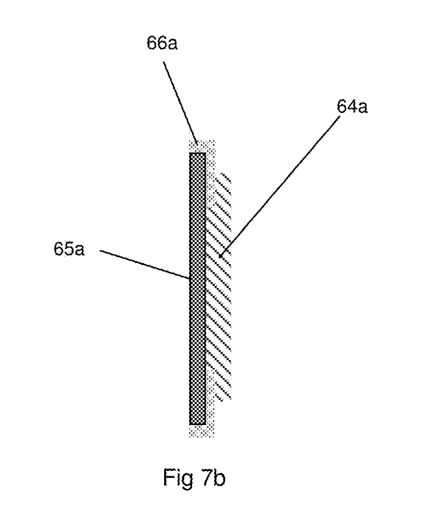

FIG. 7b shows an alternative arrangement where the conducting element 66a is deposed first on the wall 65a of the void, and then the conducting polymer 64a is deposited on top of said conducting element 66a.

Figure 8:
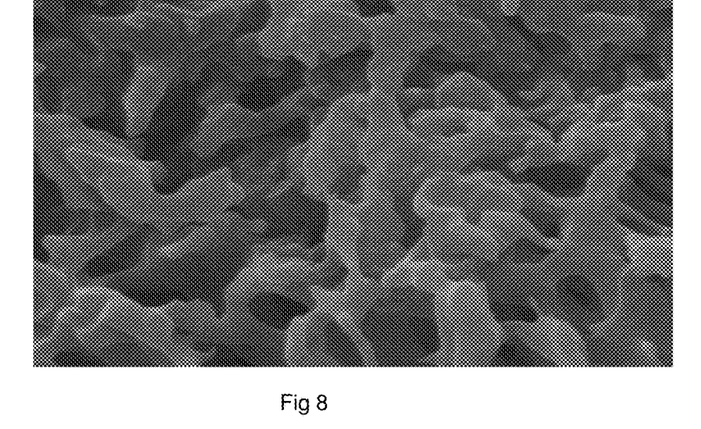
FIG. 8 shows an SEM of an intrinsically porous material.

FIG. 8 shows an SEM of an intrinsically porous material, which forms the structural support. The material has a very high surface area, such that deposition of a thin layer of conducting polymer, will have a very high surface area. The conducting polymer may be flowed in via a carrier fluid, such as a solvent, which carrier is subsequently removed to leave a deposited layer of conducting polymer. The large volume of voids in the porous polymer will reduce the thermal heat transfer across the material, and hence increase the temperature difference between the first and second layer, leading to an increase in potential difference across the thermoelectric device.

Figures 9A, 9B:
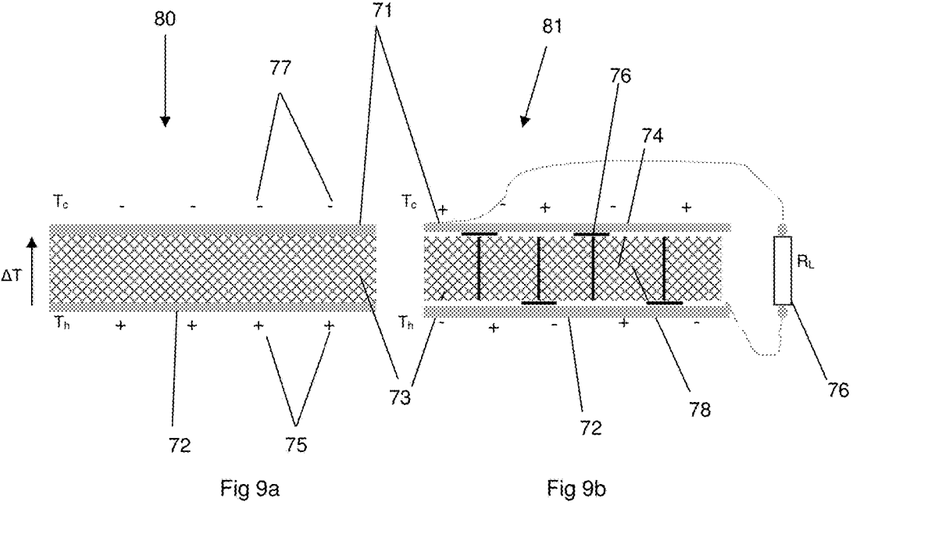
FIGS. 9a and 9b show a side projection of a thermoelectric cell with an intrinsically porous structural support.

FIG. 9a, shows a fibre reinforced thermoelectric polymer device 80, with a first conductor layer 71, and second conductor layer 72 applied to the top and bottom of the polymer thermocouple composite layer 73, which layer comprises a structural porous material 74, said material comprises a layer of conducting polymer (not shown). The polymer thermocouple layer may contain one type of conducting polymer, or both N-type and P-type conducting polymers.

When a temperature differential is applied across the polymer thermocouple 73, the thermoelectric effect will result in a net drift of electrons 75 from the hot side $T_h$ to the cold side $T_c$, 77 nominally shown as the first conductor layer 71, of the composite thus generating a voltage.

FIG. 9b shows a fibre reinforced thermoelectric polymer device 81, with a first conductor layer 71, and second conductor layer 72 applied to the top and bottom of the polymer thermocouple composite layer 73, which layer comprises discrete sections 78 which are each filled with a structural porous material 74, the internal surface of the porous material 74 is coated with a layer of conducting polymer (not shown). The structure is akin to that of FIG. 2, and the outputs are connected in series by connectors 76, so as to increase the voltage of the polymer thermocouple. Each sections 78 may have alternating P and N type materials layer may contain one type of conducting polymer, or both N-type and P-type conducting polymers.

When a temperature differential is applied across the polymer thermocouple 73, the thermoelectric effect will result in a net drift of electrons 75 from the hot side $T_h$ to the cold side $T_c$, 77 nominally shown as the first conductor layer 71, of the composite thus generating a voltage. This would enable current flow to be generated through a load resistance $R_L$ 76.

The construction of the device 80 and 81 are simple and may use current FRPC lay-up and curing technology, as the polymers are very durable and rugged any such device is therefore amenable to large area fabrication with good structural properties.

The invention claimed is:

1. A structural body having a thermoelectric device incorporated therein, the structural body comprising:
    a structural body having a structural configuration enabling it to replace a non-thermoelectric structural body in a vehicle, vessel, craft, or building; and
    a thermoelectric device incorporated into the structural body, the thermoelectric device including:
        a first conductor layer;
        a second conductor layer;
        a thermocouple layer located between the first and second conductor layers, said thermocouple layer including a structural support having an internal surface that is coated by at least one layer of at least one conducting polymer; and
        a carbon fibre skin applied on the first and second conductor layers, so as to encapsulate the device and thereby provide a fibre reinforced polymer composite structure,
    said first and second conductor layers being included in said structural body in locations that result in a temperature differential being applied between said first and second conductor layers when said structural body is incorporated in said vehicle, vessel, craft, or building.

2. The structural body according to claim 1, wherein the structural support includes a porous material comprising a plurality of voids, internal surfaces of said voids being coated with at least one layer of the at least one conducting polymer.

3. The structural body according to claim 2, wherein less than 50% of a volume of each void is filled with said at least one conducting polymer.

4. The structural body according to claim 2, wherein the porous material is an intrinsically porous material or a rigid porous three dimensional lattice.

5. The structural body according to claim 2, wherein the porous material is a rigid porous three dimensional lattice comprising:
    a plurality of elongate voids, a first of said voids including at least one layer of an N-type conducting polymer; and
    a second of said voids including at least one layer of a P-type conducting polymer.

6. The structural body according to claim 1 wherein the at least one layer of at least one conducting polymer comprises at least one layer of P-type conducting polymer and at least one layer of N-type conducting polymer.

7. The structural body according to claim 1, wherein the at least one layer of at least one conducting polymer includes a plurality of fibres or filler materials.

8. The structural body according to claim 1, wherein the at least one layer of at least one conducting polymer includes a plurality of electrically conducting fibres.

9. The structural body according to claim 1 wherein the thermocouple layer comprises a filler material.

10. The structural body according to claim 1, wherein the thermoelectric device is configured for at least one of generating electrical current and providing a Peltier cooling effect to the first or second conductor layer.

11. The structural body of claim 1, wherein the first conductor layer is included in said structural body in a location that causes it to be thermally coupled to a heat source included in the vehicle, vessel, craft, or building when said structural body is incorporated in said vehicle, vessel, craft, or building.

12. The structural body of claim 11, wherein the heat source is an exhaust or heat exchanger region of the vehicle, vessel, craft, or building.

13. A structural body having a thermodynamic electrical system incorporated therein, the structural body comprising:
    a structural body having a structural configuration enabling it to replace a non-thermoelectric structural body in a vehicle, vessel, craft, or building; and
    a thermodynamic electrical system incorporated into the structural body, the electrical system including:
        a first conductor layer;
        a second conductor layer;
        at least two thermoelectric devices extending between the first and second conductor layers, and a carbon fibre skin applied on the first and second conductor layers, so as to encapsulate the electrical system and thereby provide a fibre reinforced polymer composite structure;

each of the thermoelectric devices comprising a structural support having an internal surface that is coated by at least one layer of at least one conducting polymer, outputs of the at least two thermoelectric devices being wired in series, said first and second conductor layers being included in said structural body in locations that result in a temperature differential being applied between said first and second conductor layers when said structural body is incorporated in said vehicle, vessel, craft, or building.

14. The structural body according to claim 13, further comprising a polymer composite battery located on the first or second conductor layer.

15. A method of forming a structural body having a thermoelectric device incorporated therein, the method comprising:

forming a thermoelectric device by:
providing a rigid porous three dimensional lattice or intrinsically porous material;
deposing at least one layer of at least one P-type conducting polymer into a first predetermined region thereof;
deposing at least one layer of at least one N-type conducting polymer into a second predetermined region thereof;
applying first and second conductor layers to the three dimensional lattice, so that the three dimensional lattice is sandwiched therebetween;
curing the polymer layers; and
applying a carbon fibre skin on the first and second conductor layers, so as to encapsulate the device and thereby provide a fibre reinforced polymer composite structure; and incorporating the thermoelectric device into a structural body having a structural configuration enabling it to replace a non-thermoelectric structural body in a vehicle, vessel, craft, or building, said first and second conductor layers being incorporated in said structural body in locations that result in a temperature differential being applied between said first and second conductor layers when said structural body is incorporated in said vehicle, vessel, craft, or building.

16. A structural body having a thermoelectric device incorporated therein, the structural body comprising:

a structural body having a structural configuration enabling it to replace a non-thermoelectric structural body in a vehicle, vessel, craft, or building; and a thermoelectric device incorporated into the structural body, the thermoelectric device including:
a first conductor layer;
a second conductor layer;
a thermocouple layer located between the first and second conductor layers, said thermocouple layer including a structural support that includes a porous material having a plurality of voids; and
a carbon fibre skin applied on the first and second conductor layers, so as to encapsulate the device and thereby provide a fibre reinforced polymer composite structure,
wherein an internal surface of said voids is coated by at least one layer of at least one conducting polymer,
wherein less than 75% of a volume of each of said voids is filled with said at least one conducting polymer,
said first and second conductor layers being included in said structural body in locations that result in a temperature differential being applied between said first and second conductor layers when said structural body is incorporated in said vehicle, vessel, craft, or building.

17. The structural body according to claim 16, wherein the porous material is an intrinsically porous material or a rigid porous three dimensional lattice.

18. The structural body according to claim 17, wherein the at least one layer of at least one conducting polymer includes a plurality of fibres or filler materials.

19. The structural body according to claim 18, wherein the thermocouple layer comprises a filler material.

* * * * *